(12) United States Patent
Ting et al.

(10) Patent No.: US 7,609,524 B2
(45) Date of Patent: Oct. 27, 2009

(54) PACKAGE STRUCTURE FOR PANEL MODULE AND METHOD USING THE SAME

(75) Inventors: Chung-Kuan Ting, Taipei County (TW); Shih-Chi Chen, Miaoli County (TW); Wen-Yuan Chang, Hsinchu (TW); Chia-Chung Wu, Hsinchu County (TW)

(73) Assignee: AU Optronics Corp., Hsinchu (TW)

( * ) Notice: Subject to any disclaimer, the term of this patent is extended or adjusted under 35 U.S.C. 154(b) by 393 days.

(21) Appl. No.: 11/550,834

(22) Filed: Oct. 19, 2006

(65) Prior Publication Data

US 2007/0285904 A1  Dec. 13, 2007

(30) Foreign Application Priority Data

Jun. 8, 2006  (TW) .............................. 95120365 A

(51) Int. Cl.
H05K 7/14  (2006.01)
(52) U.S. Cl. ................... 361/752; 361/807; 361/679.02
(58) Field of Classification Search ................. 361/807, 361/752, 728, 730, 732, 740, 747, 679.01, 361/679.02, 679.21, 679.22
See application file for complete search history.

(56) References Cited

U.S. PATENT DOCUMENTS 5,097,354 A * 3/1992 Goto ....................... 359/212.1
7,006,168 B2   2/2006 Lee
7,059,473 B2 * 6/2006 Watanabe et al. ........... 206/454
2002/0159240 A1 * 10/2002 Watanabe et al. ........... 361/752
2006/0050196 A1   3/2006 Lee

FOREIGN PATENT DOCUMENTS

| CN | 1552611 | * | 5/2003 |
|---|---|---|---|
| CN | 1552611 | | 12/2004 |
| JP | 8324674 | | 12/1996 |
| JP | 2004094256 | | 3/2004 |
| JP | 2005221769 | | 8/2005 |

OTHER PUBLICATIONS

English Abstract of JP2004094256.
English Abstract of JP8324674.
English Abstract of JP2005221769.

* cited by examiner

*Primary Examiner*—Dameon E Levi
(74) *Attorney, Agent, or Firm*—Thomas, Kayden, Horstemeyer & Risley

(57) ABSTRACT

A package structure for packaging a panel module. The panel module comprises at least a gap. The package structure comprises a base and a cover. The base comprises a first loading surface for loading the panel module and at least one first engaging portion corresponding to the gap. The cover comprises a first covering surface and a second engaging portion corresponding to the first engaging portion. The first engaging portion and the second engaging portion connect the first loading surface and the first covering surface.

5 Claims, 9 Drawing Sheets

```
┌─────────────────────────────────────┐
│ Providing a package structure       │
│ comprising a base having a first    │
│ loading surface and a depression    │
│ area on the first loading surface,  │──── a
│ and at least one first engaging     │
│ portion on the first loading        │
│ surface disposed corresponding      │
│ to the gap                          │
└─────────────────────────────────────┘
                  │
                  ▼
┌─────────────────────────────────────┐
│ Placing the panel module in the     │
│ depression area and the first       │──── b
│ engaging portion is inserted into   │
│ the gap                             │
└─────────────────────────────────────┘
                  │
                  ▼
┌─────────────────────────────────────┐
│ Installing a plurality of cushions  │──── c
│ between the panel modules           │
└─────────────────────────────────────┘
```

FIG. 9

PACKAGE STRUCTURE FOR PANEL MODULE AND METHOD USING THE SAME

BACKGROUND OF THE INVENTION

1. Field of the Invention

The invention relates to a package structure, and in particular relates to a package structure for packaging panel modules, so as to convey panel modules.

2. Description of the Related Art

Referring to FIG. 1, a conventional package structure 10 comprises a base 11. The base 11 comprises a loading surface 111 which comprises a depression for accommodating a panel module 20. The panel module 20 comprises a substrate 21 and a circuit module 22. The circuit module 22 is a printed circuit board. A flexible printed circuit board 23 is disposed between the circuit module 22 and the substrate 21 for electrical connection.

Referring to FIG. 2, when the panel module 20 is placed in the package structure 10, load points A, marked with a circle, are generated. When conveying a large size panel module 20, the conventional package structure 10 can not provide enough load points A to disperse the weight of the package structure 10. Thus, conveying the panel module 20 by conventional package structure 10 increases the risk of damage. To prevent damage, another conventional package structure 10 is provided to increase a distance between the package structure 10 and panel module 20 for cushioning. Alternatively, a cushion can be inserted between the package structure 10 and panel module 20. However, these two configurations increase costs.

Because conventional package structure 10 is not able to provide enough load points A to disperse the weight of the panel module 20, only one single panel module 20 is loaded on a package structure 10.

BRIEF SUMMARY OF INVENTION

The invention provides a package structure for packaging at least a panel module. The panel module comprises a substrate, a circuit module, and a flexible printed circuit board connected to the substrate and the circuit module, wherein at least a gap exists between the substrate, the circuit module, and the flexible printed circuit board. The package structure comprises a base. The base comprises a first loading surface. The first loading surface comprises a depression area for loading the panel module and at least a first engaging portion disposed corresponding to the gap.

Another embodiment of the invention provides a package structure comprising a base, a cover, and a connecting bar. The base comprises a first loading surface and at least a first engaging portion. The first loading surface comprises a depression area for loading the panel module. The first engaging portion is disposed corresponding to the gap. The cover comprises a first covering surface and at least a second engaging portion. The second engaging portion is disposed corresponding to the first engaging portion. The connecting bar passes through the first engaging portion, the second engaging portion and the gap.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 9 is a flow chart showing the method for loading the panel module.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
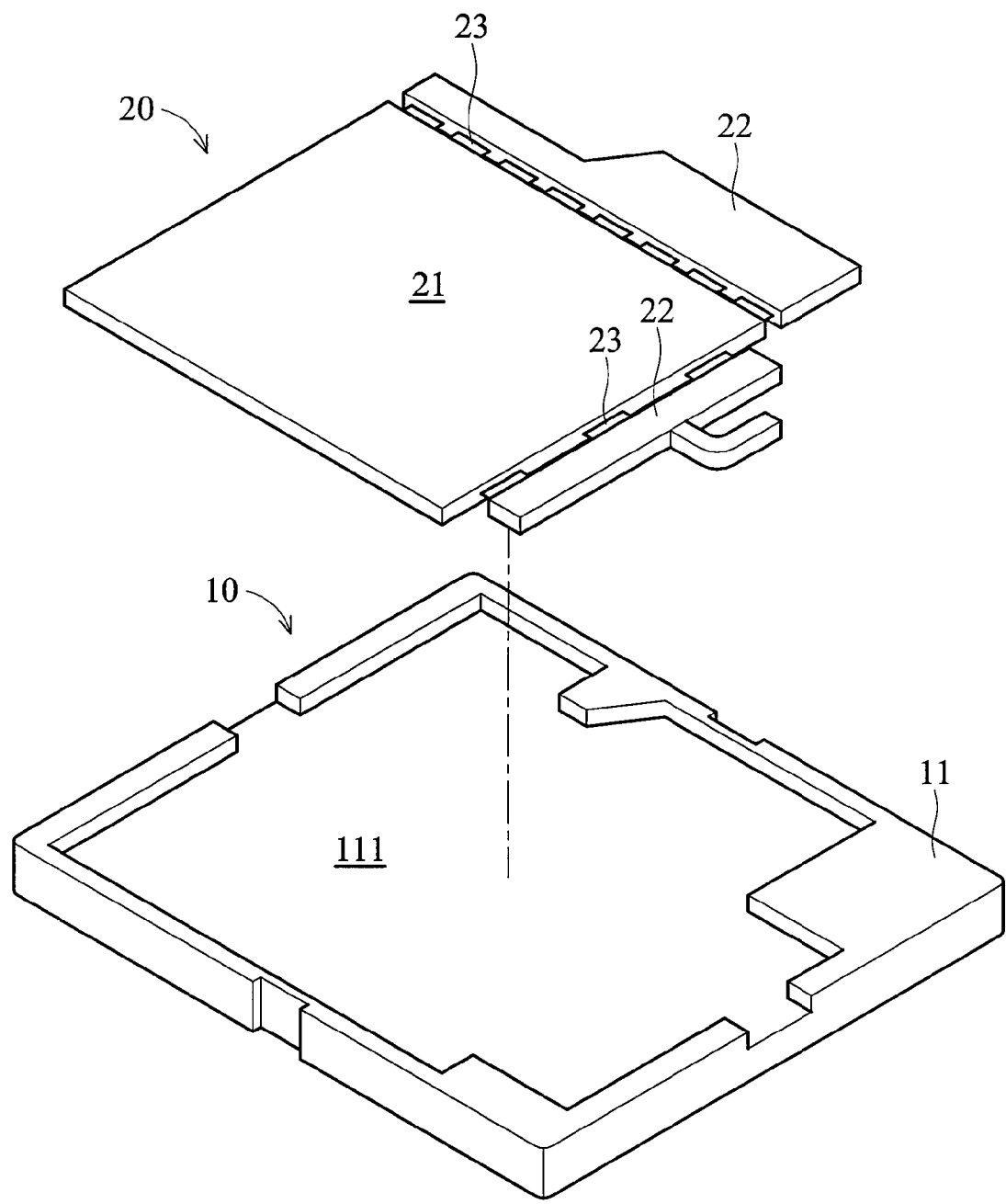
FIG. 1 shows an exploded view of a conventional package structure and a panel module.
Figure 2:
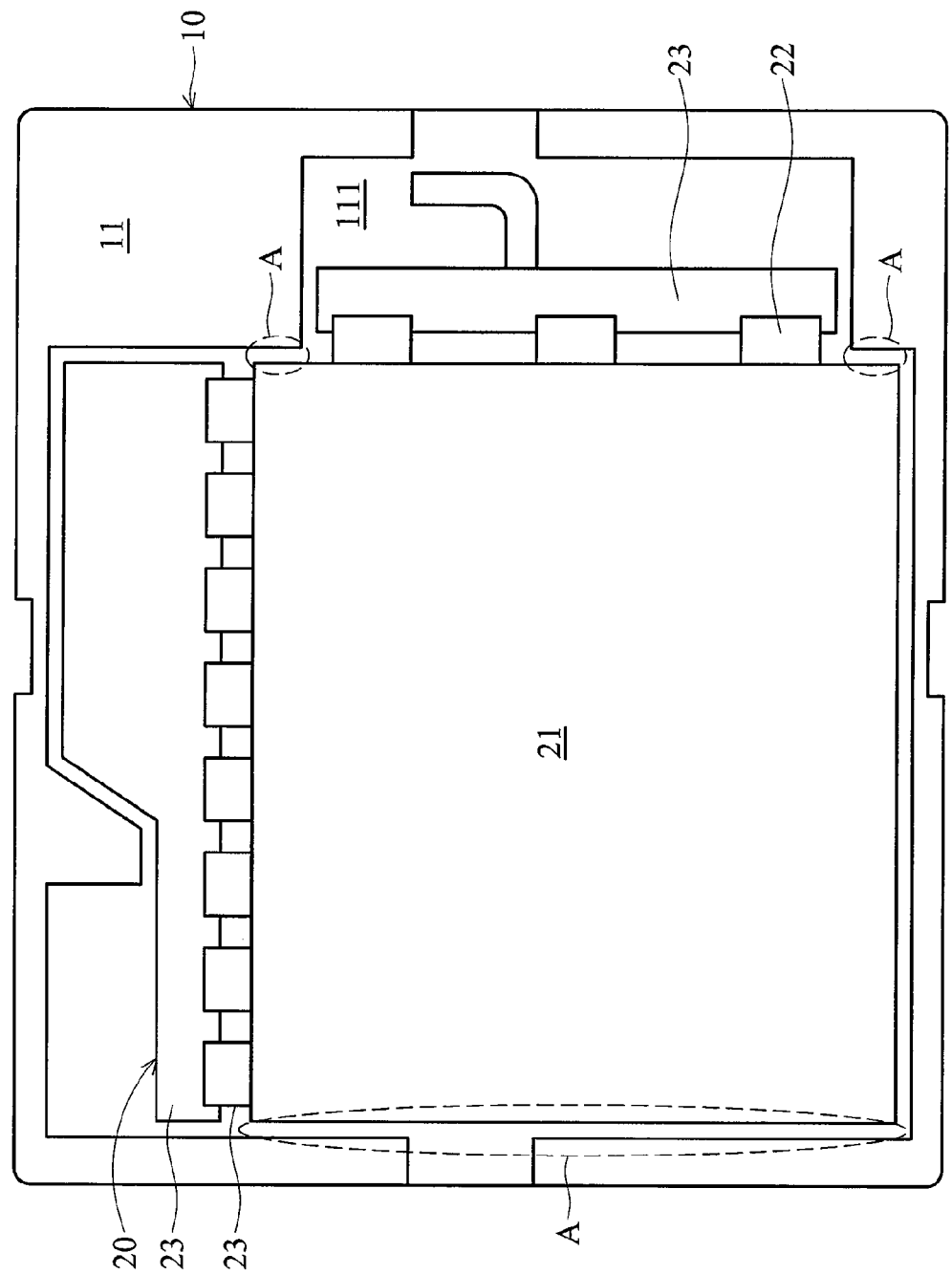
FIG. 2 is a schematic view showing load points on the conventional package structure when the panel module is placed thereon.
Figure 3:
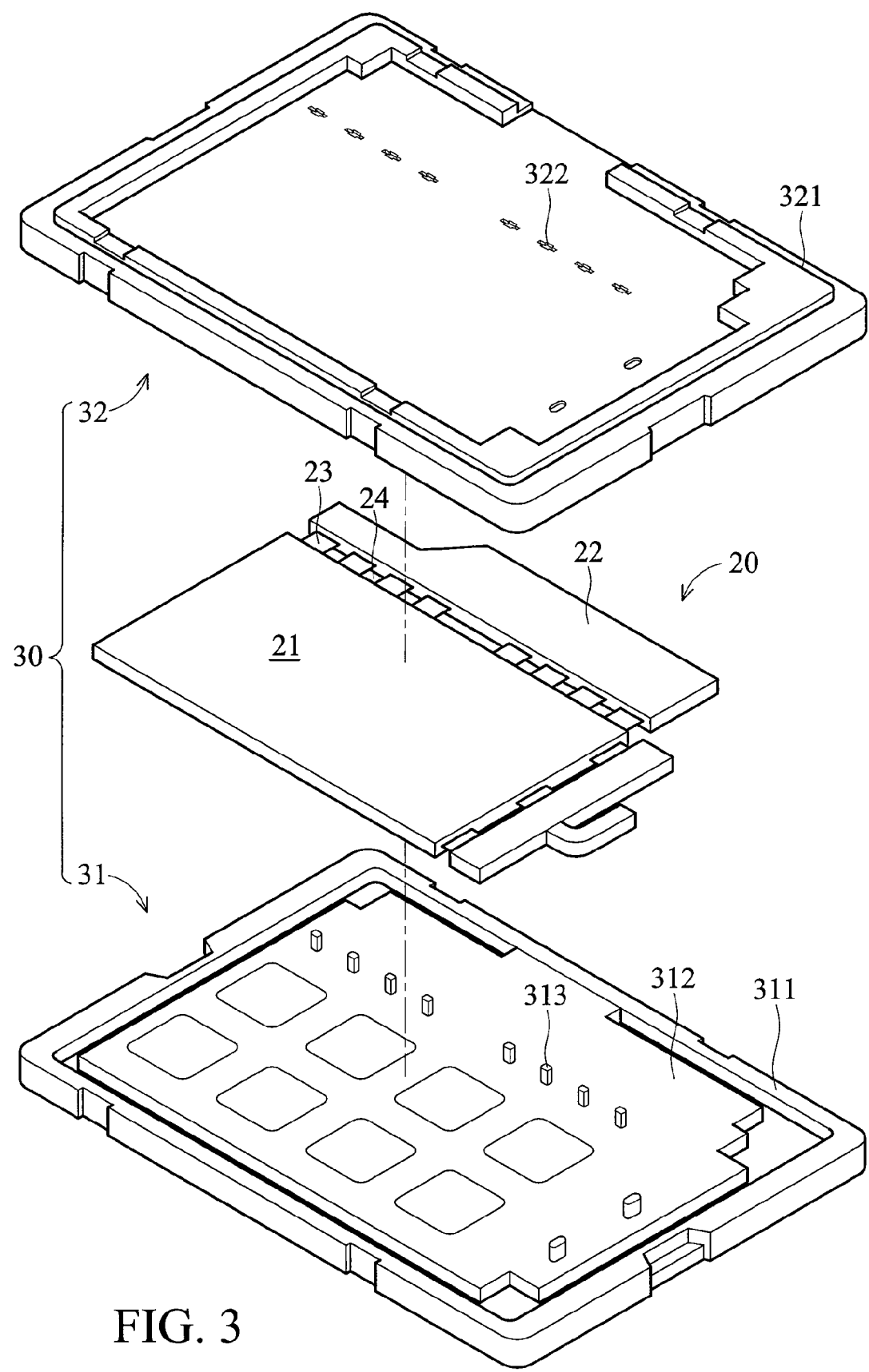
FIG. 3 is an exploded view of an embodiment of a package structure and a panel module of this invention.
Figure 4:
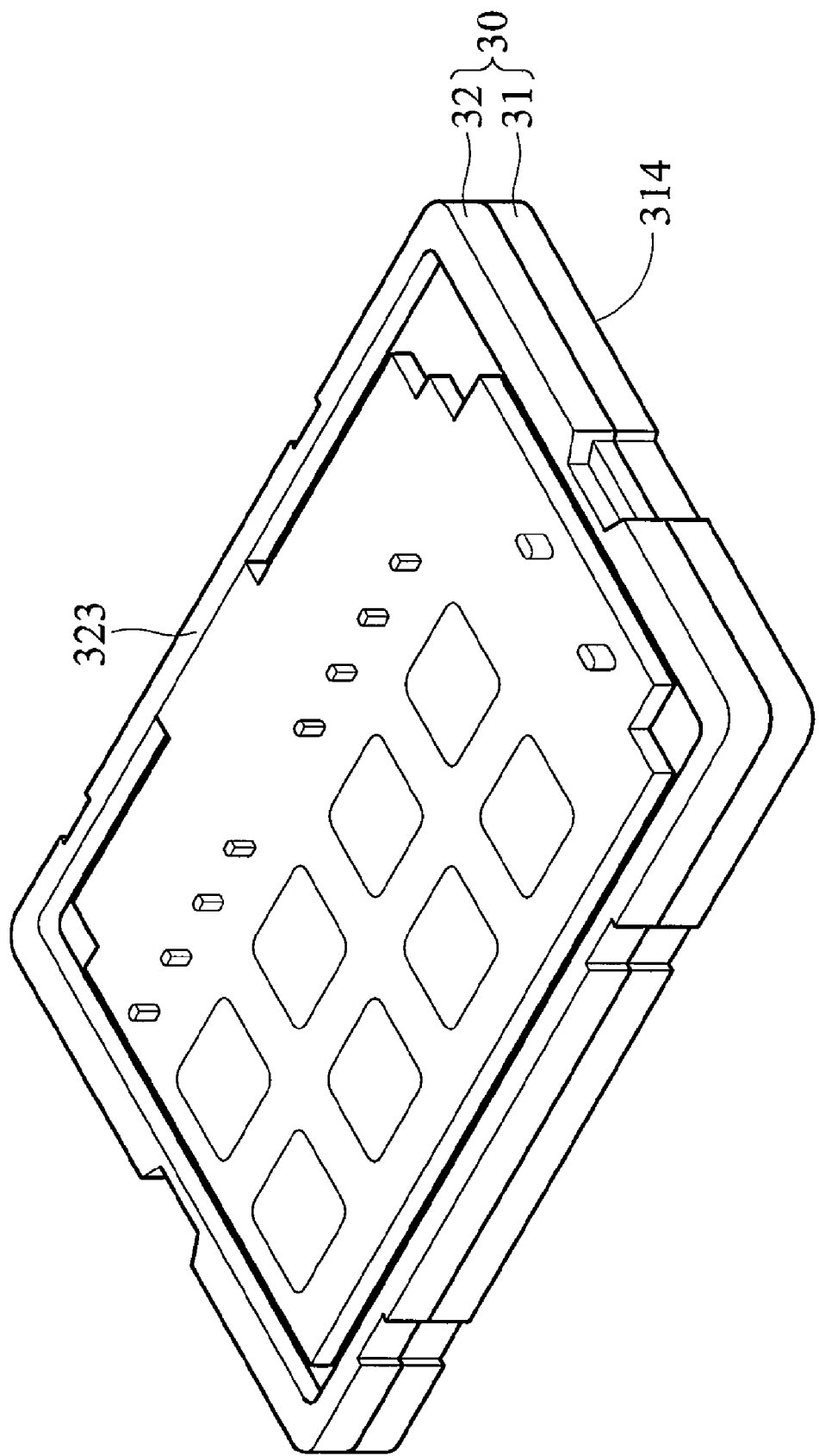
FIG. 4 is a schematic view to show the package structure to package the panel module.
Figure 5:
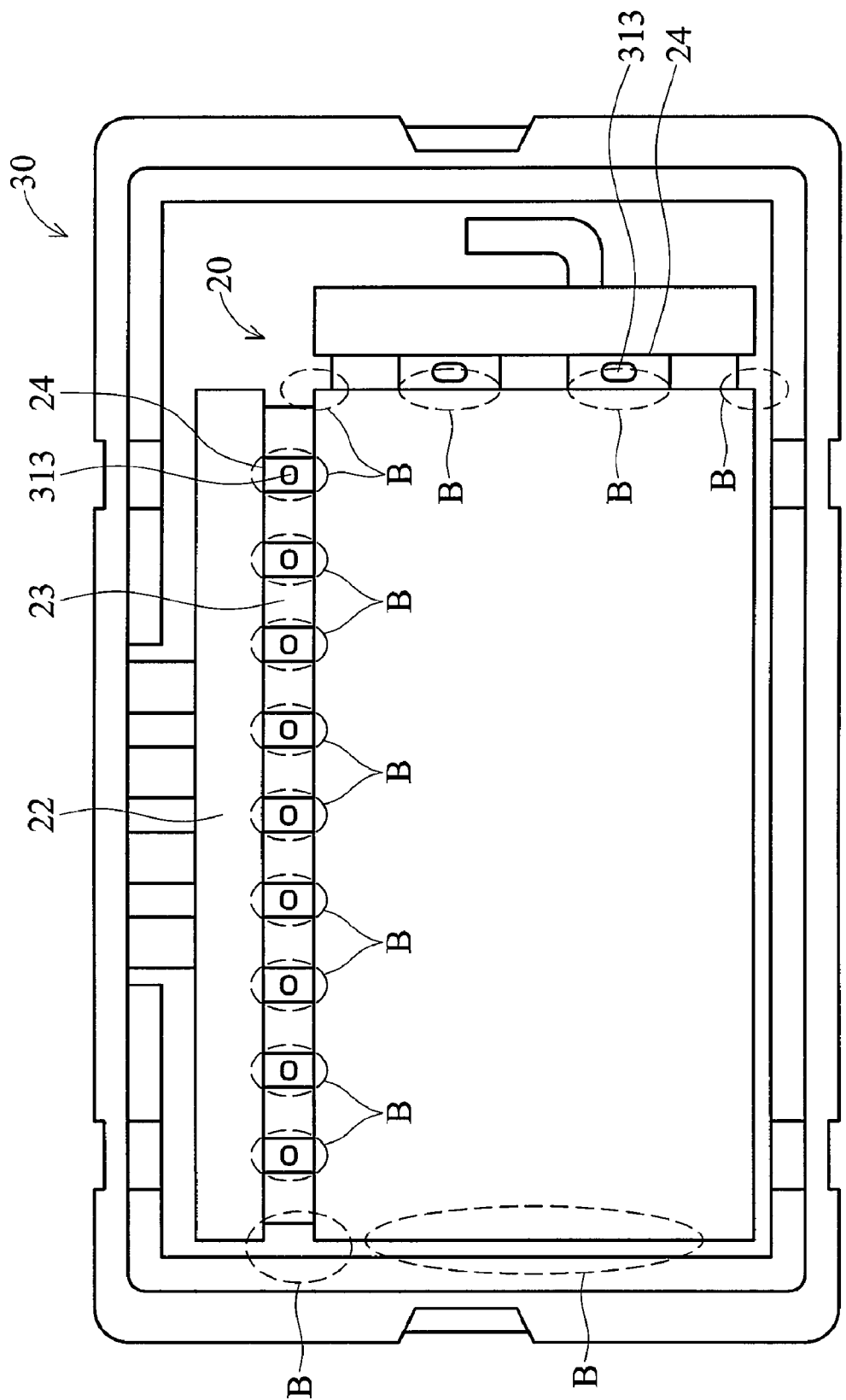
FIG. 5 is a schematic view showing load points on the package structure of the invention when the panel module is placed thereon.

Referring to FIGS. 3 and 4, a package structure 30 packages a panel module 20, wherein the panel module 20 comprises a substrate 21, a circuit module 22 and at least a flexible printed circuit board 23. In this embodiment, the amount of flexible printed circuit boards 23 is plural and the flexible printed circuit boards 23 connect to the substrate 21 and the circuit module 22. At least a gap 24 exists between the flexible printed circuit boards 23. The package structure 30 comprises a base 31 and a cover 32. The base 31 comprises a first loading surface 311. A depression area 312 is disposed on the first loading surface 311 for containing the panel module 20. A plurality of first engaging portions 313 is disposed in the depression area 312. Note that the first engaging portions 313 corresponding to the gaps 24 of the panel module 20 are a protrusion. When the panel module 20 is placed in the base 31, the first engaging portions 313 pass through the gaps 24 to engage and fix the panel module 20. The cover 32 comprises a first covering surface 321. A plurality of second engaging portions 322 is disposed on the first covering surface 321. The second engaging portions 322 are notches for engaging the first engaging portions 313. Thus, the first covering surface 321 is connected to the first loading surface 311. The base 31 further comprises a second covering surface 314 and the cover 32 further comprises a second loading surface 323 (shown by FIG. 4). The second loading surface 323 is disposed on the reverse of the first covering surface 321. The second covering surface 314 is disposed on the reverse of the first loading surface 311. The structure of the second loading surface 323 is similar to the first loading surface 311. The structure of the second covering surface 314 is similar to the first covering surface 321. The package structure 30 can be stacked vertically for packaging a plurality of panel modules 20 via the second covering surface 314 and the second loading surface 323. Note that the first engaging portions 313 may be notches and the second engaging portions 322 are protrusions. Compared with FIG. 2, the number of the load points B in FIG. 5 is increased. Thus, when the panel module 20 is placed in the base 31 of the package structure 30, the load points B can efficiently disperse the weight of the package structure 30, avoiding load concentration.

Figure 6:
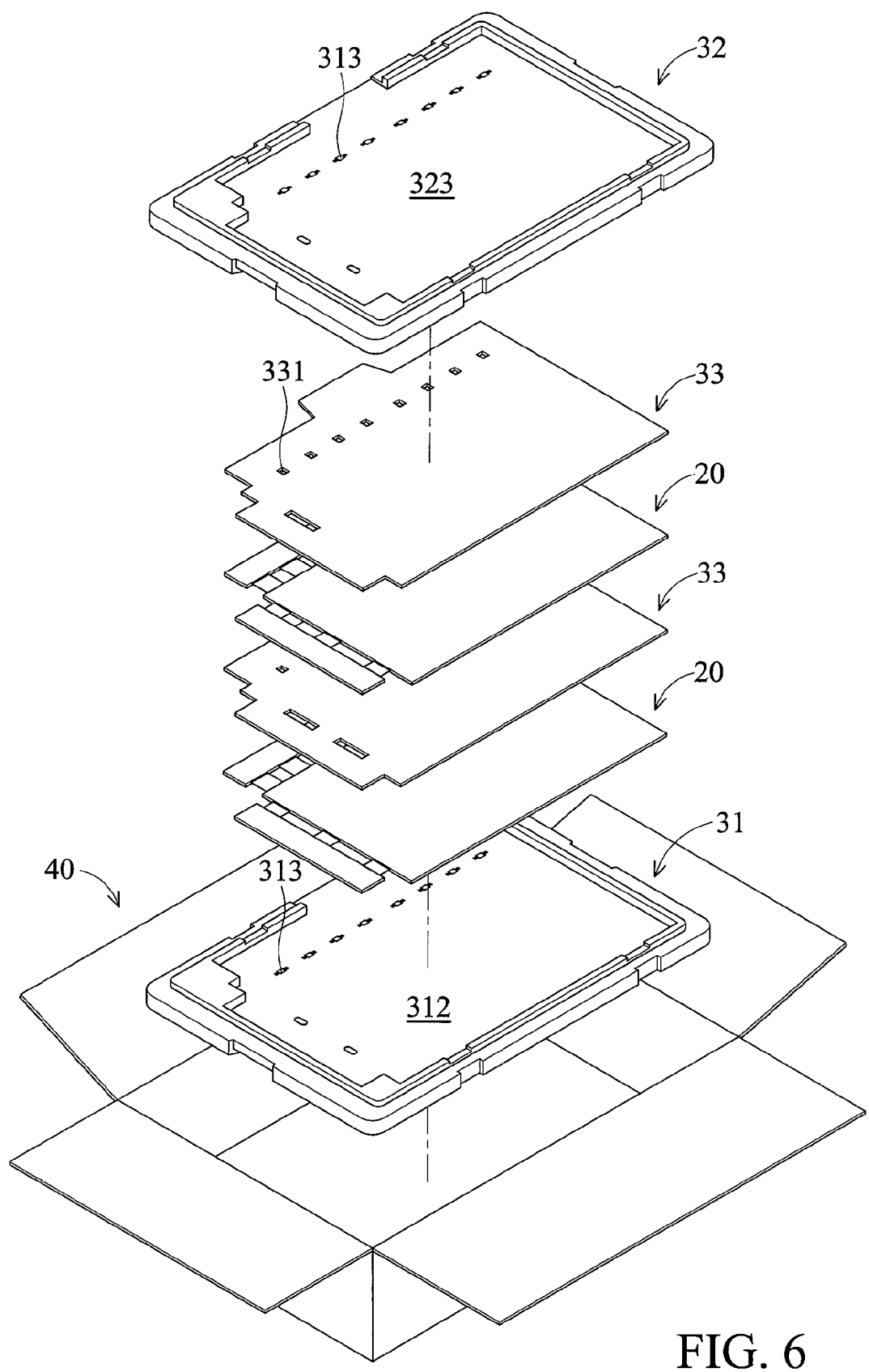
FIG. 6 is an exploded view of another embodiment of a package structure and a panel module of the invention.

The package structure 30 of the invention can disperse the weight of the panel module 20 efficiently, avoiding load concentration, thus, the package structure 30 can package a plurality of panel modules 20. Referring to FIG. 6, the package structure 30 further comprises a plurality of cushions 33. The cushions 33 are respectively disposed between the cover 32 and the panel modules 20 for cushioning. Each cushion 33 comprises holes 331 corresponding to the first engaging portions 313. Thus, the first engaging portions 313 pass through the holes 331 to engage and fix to the cushions 33. Finally, the package structure 30 is placed in a cardboard 40 to convey. Note that the cushions 33 are made of plastic foam.

Figure 7:
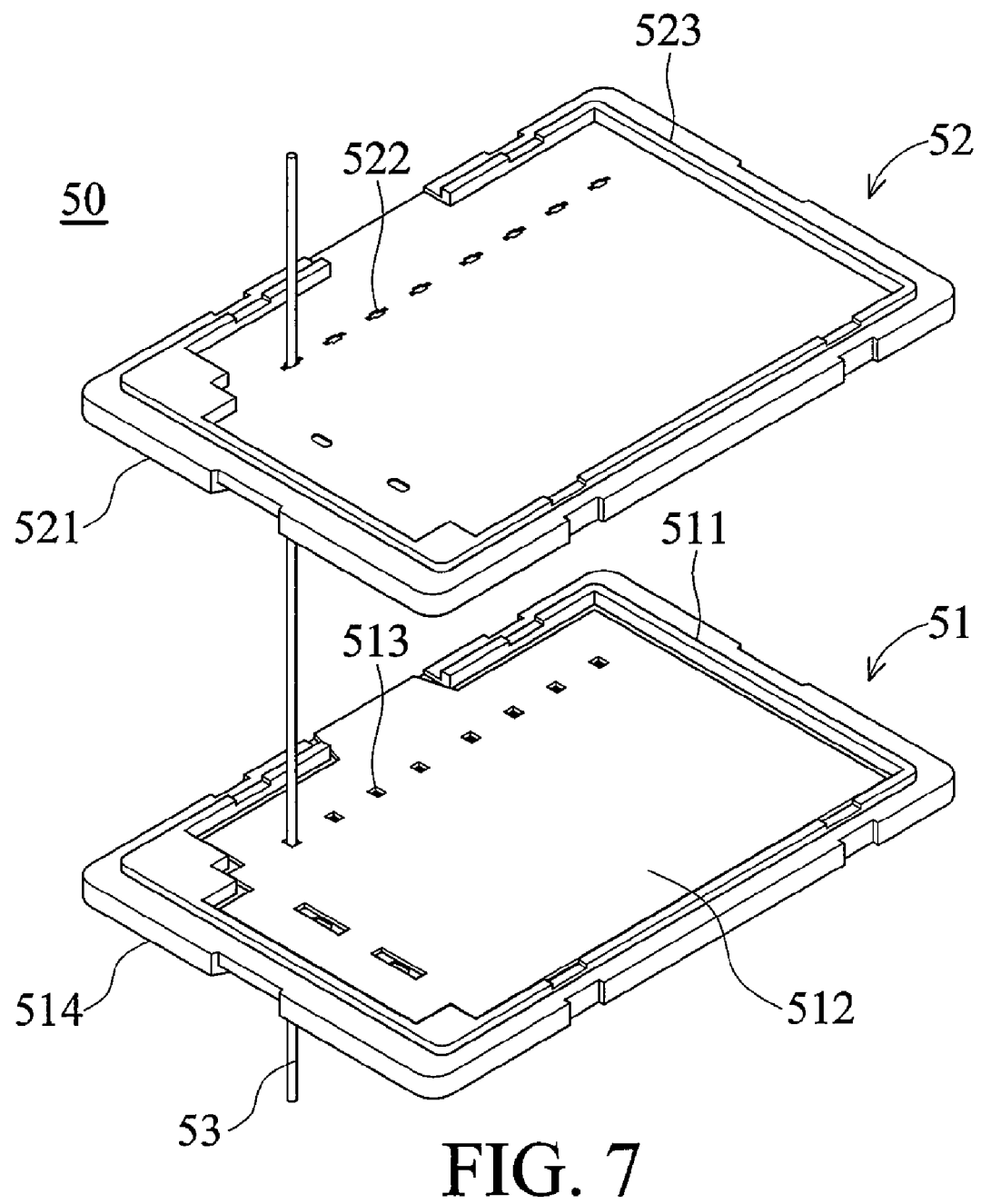
FIG. 7 is an exploded view of another embodiment of a package structure of the invention.

FIG. 7 shows another embodiment of the invention. The package structure 50 comprises a base 51, a cover 52 and a connecting bar 53. The base 51 comprises a first loading surface 511 and a plurality of first engaging portions 513. The first loading surface 511 comprises a depression area 512 for containing the panel module 20. Note that the first engaging portions 513 are disposed corresponding to the gaps 24 of the panel module 20 (shown in FIG. 3). The cover 52 comprises a first covering surface 521 and a plurality of second engaging portions 522. The structure of the first covering surface 521 is similar to the first loading surface 511. The second engaging portions 522 correspond to the first engaging portions 513. Note that the first engaging portions 513 and the second engaging portions 522 are holes. The connecting bar 53 passes through the first engaging portions 513, the second engaging portions 522 and the gaps 24. The base 51 further comprises a second covering surface 514 and the cover 52 further comprises a second loading surface 523. The second covering surface 514 is disposed on the reverse of the first loading surface 511. The second loading surface 523 is disposed on the reverse of the first covering surface 521. The structure of the second covering surface 514 is similar to the first covering surface 521. The structure of the second loading surface 523 is similar to the first loading surface 511. The package structure 50 can be stacked vertically for packaging a plurality of panel module 20 via the second covering surface 514 and the second loading surface 523. In this embodiment, the connecting bar 53 connects the cover 52 to the base 51 and efficiently disperses the weight of the panel module 20, avoiding load concentration.

Figure 8:
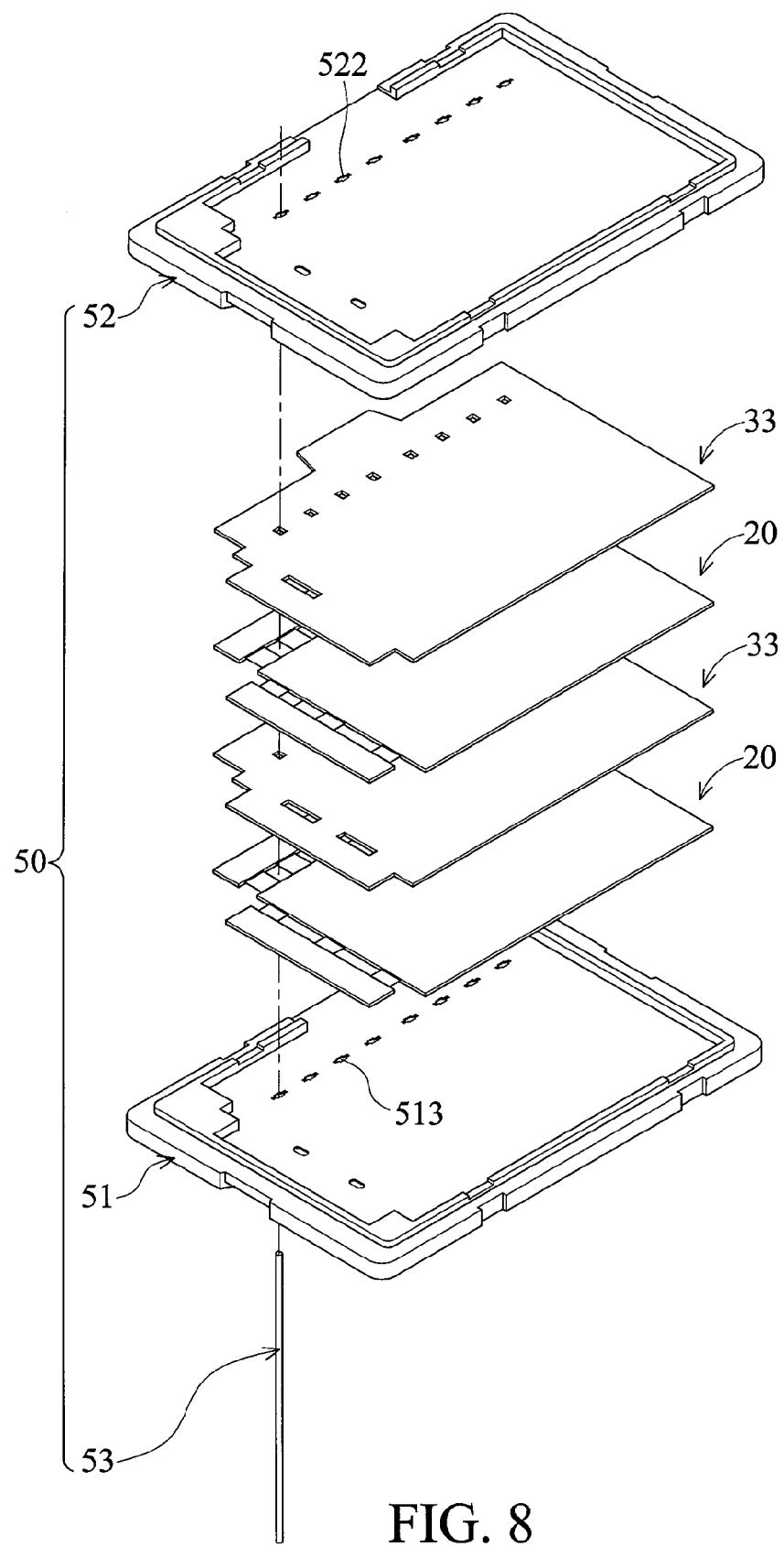
FIG. 8 is an exploded view of another embodiment of a package structure and a panel module of the invention.

The package structure 50 of the invention can efficiently disperse the weight of the panel module 20, avoiding load concentration, thus, the package structure 50 can package a plurality of panel modules 20. Referring to FIG. 8, the package structure 50 further comprises a plurality of cushions 33. The cushions 33 are respectively disposed between the cover 32 and the panel modules 20 for cushioning. Each cushion 33 comprises holes 331 corresponding to the connecting bar 53. Thus, the connecting bar 53 passes through the holes 331 to engage and fix to the cushions 33. Note that the cushions 33 are made of plastic foam.

FIG. 9 is a flow chart showing method for loading a panel module. Referring to FIGS. 3, 6 and 9, the panel module 20 comprises a substrate 21, a circuit module 22, and a flexible printed circuit board 23 connected to the substrate 21 and the circuit module 22, at least one gap 24 being formed between the substrate 21, the circuit module 22, and the flexible printed circuit board 23. The steps comprise a. providing a package structure 30 comprising a base 31 having a first loading surface 311 and a depression area 312 on the first loading surface 311, and at least one first engaging portion 313 on the first loading surface 311 disposed corresponding to the gap 24. The step b. is placing the panel module 20 in the depression area 312 and the first engaging portion 313 is inserted into the gap 24. When a plurality of panel modules 20 are placed in the depression area 312, the step c. is installing a plurality of cushions 33 between the panel modules 20.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure for loading a panel module, wherein the panel module comprises a substrate, a circuit module, and a flexible printed circuit board connected to the substrate and the circuit module, at least one gap being formed between the substrate, the circuit module, and the flexible printed circuit board, the package structure comprising:
   a base having a first loading surface, and a depression area on the first loading surface for loading the panel module;
   at least one first engaging portion on the first loading surface disposed corresponding to the gap;
   a cover having first covering surface; and
   a second engaging portion formed on the cover and corresponding to the first engaging portion;
   a connecting bar passing through the base and the cover via the first engaging portion and the second engaging portion, wherein the first engaging portions and the second engaging portions are holes.

2. The package structure as claimed in claim 1, wherein the base further has a second covering surface is disposed on the reverse of the first loading surface of the cover.

3. The package structure as claimed in claim 1, wherein the cover further has a second loading surface is disposed on the reverse the first covering surface of the cover.

4. The package structure as claimed in claim 1, further comprising at least one cushion disposed between the cover and the panel module.

5. The package structure as claimed in claim 4, wherein the cushion is made of plastic foam.

* * * * *